(12) United States Patent
Handa et al.

(10) Patent No.: US 10,650,942 B2
(45) Date of Patent: May 12, 2020

(54) POST-FITTING SHIELD MEMBER, SHIELDED WIRE, MANUFACTURING METHOD OF SHIELDED WIRE, AND MANUFACTURING METHOD OF POST-FITTING SHIELD MEMBER

(71) Applicant: Yazaki Corporation, Minato-ku, Tokyo (JP)

(72) Inventors: Yutaka Handa, Susono (JP); Hiroki Kondo, Susono (JP); Satoko Hongo, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/196,468

(22) Filed: Nov. 20, 2018

(65) Prior Publication Data
US 2019/0164671 A1 May 30, 2019

(30) Foreign Application Priority Data
Nov. 28, 2017 (JP) .................................. 2017-227480

(51) Int. Cl.
| | | |
|---|---|---|
| H01B 7/00 | (2006.01) | |
| H01B 13/22 | (2006.01) | |
| H01B 13/00 | (2006.01) | |
| H01B 5/14 | (2006.01) | |
| H01B 7/22 | (2006.01) | |
| H01B 13/008 | (2006.01) | |
| H05K 9/00 | (2006.01) | |

(52) U.S. Cl.
CPC ............... *H01B 13/22* (2013.01); *H01B 5/14* (2013.01); *H01B 7/226* (2013.01); *H01B 13/008* (2013.01); *H01B 13/0016* (2013.01); *H01B 13/0036* (2013.01); *H05K 9/0098* (2013.01)

(58) Field of Classification Search
CPC ... H01B 7/02; H01B 7/04; H01B 7/06; H01B 7/18
USPC .......... 174/102 R, 103, 105, 106 R, 108, 109
See application file for complete search history.

(56) References Cited

U.S. PATENT DOCUMENTS

| | | | | |
|---|---|---|---|---|
| 2,313,234 A | * | 3/1943 | Gavitt | H01B 7/0009 174/120 SR |
| 3,649,744 A | * | 3/1972 | Coleman | H01B 7/182 174/107 |

(Continued)

FOREIGN PATENT DOCUMENTS

| | | | | |
|---|---|---|---|---|
| JP | 2007-0194084 | * | 8/2007 | ............... H01B 7/17 |
| JP | 2007-194084 A | | 8/2007 | |
| JP | 2011-100713 A | | 5/2011 | |

*Primary Examiner* — William H. Mayo, III
(74) *Attorney, Agent, or Firm* — Banner & Witcoff, Ltd.

(57) ABSTRACT

A post-fitting shield member to be post-fitted with an electric wire is a plated fiber bundle wound in coil form and formed by performing metal plating on a high-strength fiber member. A manufacturing method of a shielded wire includes an insertion step of inserting an electric wire into the post-fitting shield member having a coil shape; a first fixing step of fixing one end portion of the post-fitting shield member into which the electric wire was inserted in the insertion step; an expansion step of expanding the post-fitting shield member that was fixed in the first fixing step toward the side of its other end portion; and a second fixing step of fixing the other end portion of the post-fitting shield member that was expanded in the expansion step.

7 Claims, 5 Drawing Sheets

(56) References Cited

U.S. PATENT DOCUMENTS

| | | | | |
|---|---|---|---|---|
| 3,794,750 A * | 2/1974 | Garshick | ................. | H01B 7/26 |
| | | | | 174/36 |
| 4,727,222 A * | 2/1988 | Sato | .................. | H01B 11/1041 |
| | | | | 174/108 |
| 5,142,100 A * | 8/1992 | Vaupotic | ............. | H01B 7/1855 |
| | | | | 174/24 |
| 7,323,640 B2 * | 1/2008 | Takahashi | ............ | H01B 11/002 |
| | | | | 174/106 R |
| 8,598,459 B2 * | 12/2013 | Eshima | ............. | H01B 11/1821 |
| | | | | 174/102 R |
| 2011/0079410 A1 | 4/2011 | Eshima | | |

* cited by examiner

POST-FITTING SHIELD MEMBER, SHIELDED WIRE, MANUFACTURING METHOD OF SHIELDED WIRE, AND MANUFACTURING METHOD OF POST-FITTING SHIELD MEMBER

CROSS-REFERENCE TO RELATED APPLICATIONS

This application is based on and claims priority under 35 USC 119 from Japanese Patent Application No. 2017-227480 filed on Nov. 28, 2017, the contents of which are incorporated herein by reference.

TECHNICAL FIELD

The present invention relates to a post-fitting shield member, a shielded wire, a manufacturing method of a shielded wire, and a manufacturing method of a post-fitting shield member.

BACKGROUND ART

A shielded wire is known in which an electric wire is covered with a shield layer. In such shielded wire, for example a metal braid formed by metal element wires, a metal foil, or the like is used as the shielded layer. Further, another example of the shield layer is a braid formed by plated fibers.

A further example of the shield layer is sets of twisted metal element wires wound on an electric wire spirally (refer to Patent document 1, for example). In this shield layer, since the sets of twisted metal element wires are wound on the electric wire at a prescribed pitch so as to form gaps between them in the longitudinal direction, the metal element wires do not rub against each other unlike in a metal braid. And this shield layer is free of a phenomenon that large strain occurs there when twisted unlike in spiral shields. As such, this shield layer is low in the probability of disconnection of metal element wires.

PRIOR ART DOCUMENTS

Patent Documents

Patent document 1: JP-A-2011-100713

SUMMARY OF INVENTION

In the shielded wire disclosed in Patent document 1, the sets of twisted metal element wires are wound spirally on the center electric wire by a winding machine or the like and then covered with a sheath. To use such a shield layer as a post-fitting shield member, for example, sets of manufactured twisted metal element wires are wound on an electric wire by manual work so as to keep a prescribed pitch. In this case, the work efficiency of attaching the post-fitting shield member to the electric wire is never high.

In view of the above, the present inventors have conceived a manufacturing method that a coil-shaped post-fitting shield member that is shorter than an electric wire (i.e., a post-fitting shield member compressed in coil form in the longitudinal direction of the electric wire) is manufactured, the electric wire is inserted into it, and the post-fitting shield member is then expanded.

However, where the post-fitting shield member is formed by metal element wires (e.g., twisted metal element wires), when they are expanded a phenomenon is prone to occur that metal element wires are hooked on the covering of the metal wire and thereby deformed plastically, to cause a deviation in the spiral winding pitch of expanded metal element wires.

Metals are not wide in the elastic range and hence are easily deformed plastically. Thus, the pitch of expanded metal element wires becomes too long or too short at certain locations depending on how expanding force acts on the metal element wires. This makes it very difficult to obtain a uniform pitch distribution.

Furthermore, since metals are not wide in the elastic range, if external force acts on the coiled twisted wires before expansion (post-fitting shield member), they may be deformed plastically from the coil shape into, for example, a thin and flat shape, in which case it is difficult to post-fit them with an electric wire (i.e., insert the electric wire into them).

The present invention has been made to solve the above problems, and an object of the invention is therefore to provide a post-fitting shield member that does not make post fitting difficult and is given a uniform pitch distribution after its expansion, a shielded wire using it, a manufacturing method of such a shielded wire, and a manufacturing method of such a post-fitting shield member.

A post-fitting shield member according to the present invention is one to be post-fitted with an electric wire. The post-fitting shield member is formed by winding in a coil shape a plated fiber bundle with metal plating on a high-strength fiber member.

In this post-fitting shield member, since the plated fiber bundle formed by performing metal plating on the high-strength fiber member is wound in coil form, the high-strength fiber member in plating layers is not easily deformed plastically even if a plated fiber member is hooked on a certain member when the electric wire is inserted into the coil-shaped plated fiber bundle and the plated fiber bundle is expanded. Thus, a pitch deviation due to plastic deformation can be prevented. Furthermore, even if external force acts on the expanded plated fiber bundle, the high-strength fiber members are not easily deformed plastically but maintained in shape. Thus, the post-fitting shield member does not make post fitting difficult and is given a uniform pitch distribution after its expansion.

In the post-fitting shield member according to the present invention, it is preferable that the plated fiber bundle is thin and flat and has a flat surface that faces the center line of the coil shape.

According to this post-fitting shield member, since the plated fiber bundle is thin and flat and one of the flat surfaces faces the coil center line, when the plated fiber bundle is used as part of the shielded wire, its one flat surface comes into contact with the electric wire. As a result, the close contactness between the plated fiber bundle and the electric wire is increased to stabilize the shielding effect. Furthermore, the shielded wire is covered with a wide plated fiber bundle, whereby the shielding performance can be enhanced.

In the post-fitting shield member according to the present invention, it is preferable that in a state that the plated fiber bundle is wound on the electric wire having an outer diameter D spirally at a pitch P after the post-fitting shield member is post-fitted with the electric wire, an inner diameter d of the plated fiber bundle satisfies: $d^2 = \{(\pi D)^2 + P^2\}/\pi^2$.

According the post-fitting shield member, since the above formula (1) is satisfied, the plated fiber bundle can be wound spirally at the pitch P on the electric wire having the outer diameter D.

A shielded wire according to the present invention includes the above-described post-fitting shield member and an electric wire which is inserted in the post-fitting shield member having the coil shape. The post-fitting shield member is elongated so as to be longer than its natural length, and wound on the electric wire spirally.

According to the shielded wire, this shielded wire is equipped with the post-fitting shield member and the electric wire. Further, the post-fitting shield member is in a state that it is elongated so as to be longer than its natural length and wound on the electric wire spirally. Since the electric wire is inserted into the post-fitting shield member that has not been expanded yet, the efficiency of work can be made higher than in a case that it is inserted into a post-fitting shield member that is long in its longitudinal direction.

It is preferable that the shielded wire according to the invention satisfies $TN/\pi D \geq 0.5$, where T is the width of each plated fiber bundle, N is the number of plated fiber bundles, and D is the outer diameter of the electric wire.

Since this shielded wire satisfies the above formula (3), it exhibits a shielding effect that is larger than or equal to 30 dB which is, in general, considered a minimum allowable level.

A manufacturing method of a shielded wire according to the present invention includes an insertion step of inserting an electric wire into one of the above-described post-fitting shield members having the coil shape; a first fixing step of fixing one end portion of the post-fitting shield member into which the electric wire was inserted in the insertion step; an expansion step of expanding the post-fitting shield member that was fixed in the first fixing step toward the side of its other end portion; and a second fixing step of fixing the other end portion of the post-fitting shield member that was expanded in the expansion step.

According to the manufacturing method of the shielded wire, this manufacturing method of the shielded wire is higher in work efficiency than in a case that the electric wire is inserted into a post-fitting shield member that is long in its longitudinal direction.

Further, a manufacturing method of a post-fitting shield member includes a plating step of performing metal plating on high-strength fiber member or members; a heat treatment step of winding a plated fiber bundle obtained by the plating step into a coil shape and subjecting the wound plated fiber bundle to heat treatment of a prescribed temperature or higher and a prescribed time or longer; and a cooling step of cooling the wound plated fiber bundle as subjected to the heat treatment.

The present inventors found that high-strength fiber members soften when subjected to heat treatment, and that when a coil-shaped plated fiber bundle is then cooled, fiber shapes are fixed so that the plated fiber bundle will maintain its shape. Thus, this manufacturing method of a post-fitting shield member can produce a post-fitting shield member in which a coil shape is maintained by winding the plated fiber bundle into a coil shape having a prescribed diameter, subjecting it to heat treatment, and then cooling it.

The present invention can provide a post-fitting shield member that does not make post fitting difficult and is given a uniform pitch distribution after its expansion, a shielded wire using it, a manufacturing method of such a shielded wire, and a manufacturing method of such a post-fitting shield member.

DESCRIPTION OF EMBODIMENTS

Figure 1:
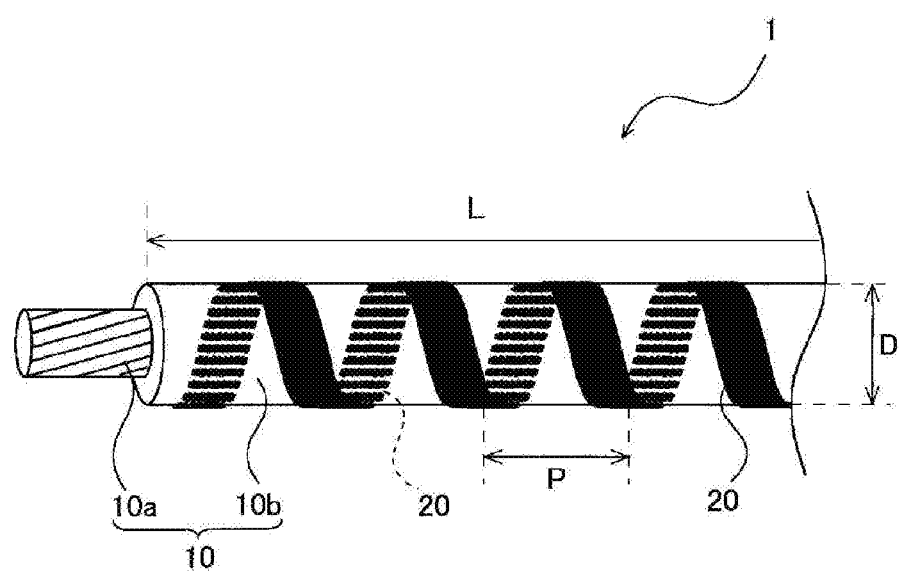
FIG. 1 shows the structure of a shielded wire including a post-fitting shield member according to an embodiment of the present invention.

A preferred embodiment of the present invention will be hereinafter described. The present invention is not limited to the embodiment described below, and various modifications are possible without departing from the spirit and scope of the invention. In the embodiment described below, part of the constituent elements will not be shown in the drawings or will be omitted in the description. It goes without saying that known techniques are applied to those constituent elements as appropriate within the confines that no contradictions to the following description will occur.

FIG. 1 shows the structure of a shielded wire 1 including a post-fitting shield member 20 according to the embodiment. As shown in FIG. 1, in the shielded wire 1, the post-fitting shield member 20 is provided as a post-fitting shield layer around an electric wire 10.

The electric wire 10 is formed in such a manner that a conductor 10a made of a conductive metal is covered with an insulator 10b. Although in the embodiment the conductor 10a is twisted element wires, the invention is not limited to that case; the conductor 10a may be a single wire, for example Plural electric wires may be used instead of the single electric wire 10.

Figure 2:
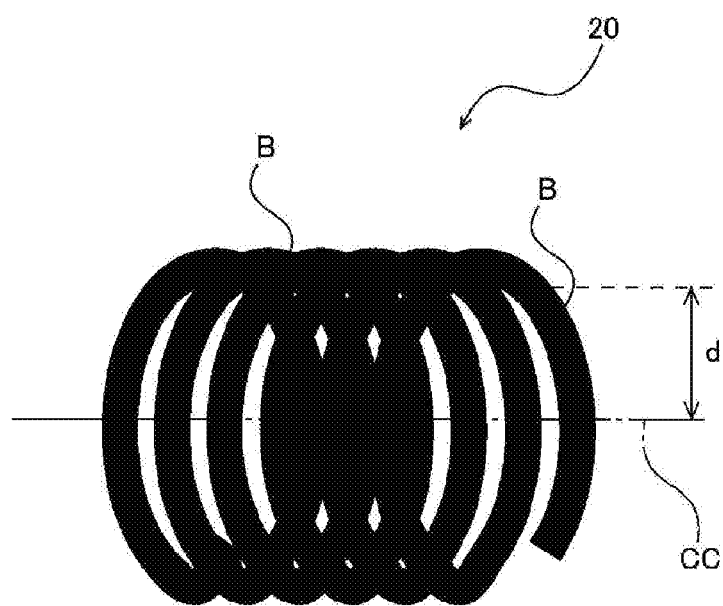
FIG. 2 shows the structure of the post-fitting shield member.

The post-fitting shield member 20 is a conductive member and is disposed around the electric wire 10 to exhibit a shielding effect. FIG. 2 shows the structure of the post-fitting shield member 20. As shown in FIG. 2, the post-fitting shield member 20 is formed in such a manner that a bundle B of plural plated fiber members each of which is formed by subjecting a high-strength fiber member to metal plating is wound in coil form. Alternatively, the post-fitting shield member 20 may have a single high-strength fiber member.

The term "high-strength fiber" means a fiber material that is synthesized chemically from such a material as petroleum and that is larger than or equal to 1 GPa in breaking tensile strength and from is 1% to 10% in breaking extension ratio. Examples of such fiber is aramid fiber, polyacrylate fiber, and PBO fiber.

Figure 3:
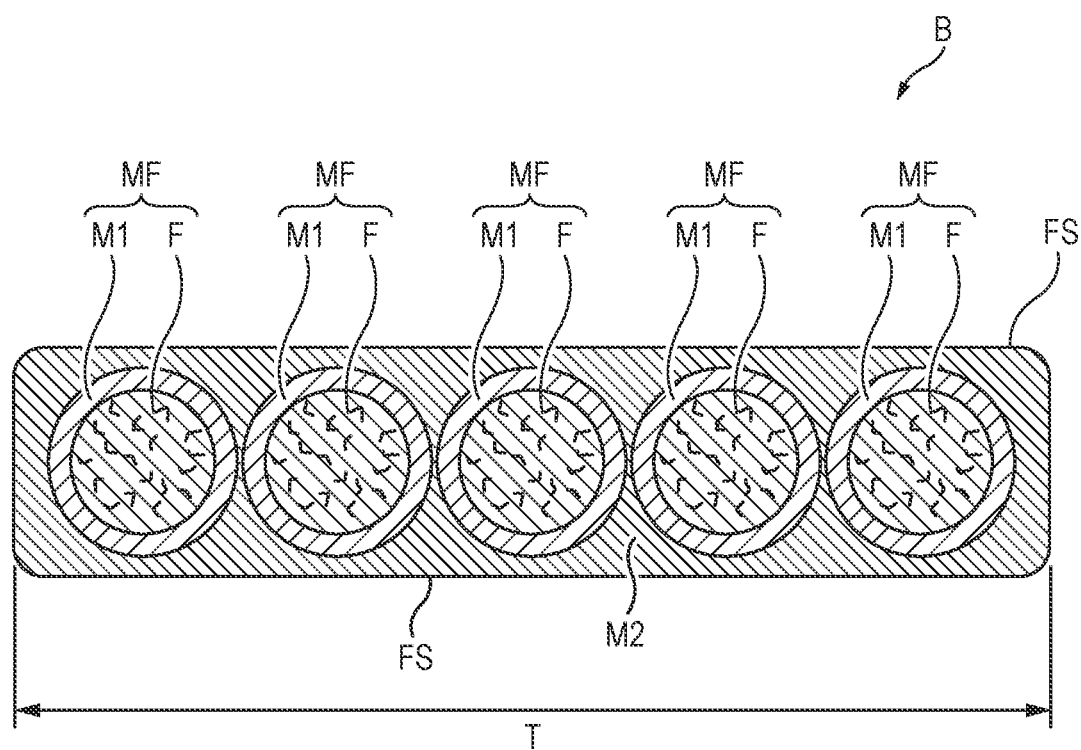
FIG. 3 is a sectional view of a plated fiber bundle used in the post-fitting shield member shown in FIG. 2.

FIG. 3 is a sectional view of the plated fiber bundle B that constitutes the post-fitting shield member 20 shown in FIG. 2. As shown in FIG. 3, the plated fiber bundle B (i.e., a bundle of plated fiber members MF) is thin and flat in cross section. The plated fiber bundle B is composed of plural high-strength fiber members F, first metal plating layers M1, and a second metal plating layer M2.

Each first metal plating layer M1 is a metal plating layer that is formed on a high-strength fiber member F. In the embodiment, each first metal plating layer M1 is made of copper, for example Each plated fiber member MF is produced by forming a first metal plating layer M1 on a high-strength fiber member F.

The second metal plating layer M2 is a metal plating layer that is formed by plating the plural plated fiber member MF together. In the embodiment, the second metal plating layer M2 is made of tin, for example.

Although in the plated fiber bundle B shown in FIG. 3 the plural plated fiber members MF are arranged parallel with each other so as to form a single layer in the thickness direction, the invention is not limited to this case; plural plated fiber member MF may be arranged in plural layers in the thickness direction. Furthermore, the invention is not limited to the case that the plural plated fiber members MF are arranged parallel with each other; they may be slanted within the width of the plated fiber bundle B.

The structure of the plated fiber bundle B is not limited to the one shown in FIG. 3. For example, the first metal plating layers M1 may be omitted. Another example is possible in which the second metal plating layer M2 is omitted and separate plated fiber members MF are twisted together into a thin and flat bundle B. Furthermore, a plated fiber bundle B is possible that is produced by forming a third metal plating layer (and a further metal plating layer or layers) on the plated fiber bundle B shown in FIG. 3.

Again referring to FIG. 2, the post-fitting shield member 20 is formed by winding the plated fiber bundle B shown in FIG. 3 into a coil shape. In particular, in the post-fitting shield member 20 according to the embodiment, one of flat surfaces FS (top and bottom surfaces in the thickness direction; see FIG. 3) of the plated fiber bundle B faces the coil center line CC, that is, the flat surfaces FS are approximately perpendicular to a straight line drawn from the coil center line (coil axis) CC to the plated fiber bundle B.

The post-fitting shield member 20 shown in FIG. 1 is formed by expanding the post-fitting shield member 20 shown in FIG. 2 along the coil axis. The post-fitting shield member 20 has a natural length in the state shown in FIG. 2. As a result of the expansion, the post-fitting shield member 20 is reduced in diameter and wound on the outer surface of an electric wire 10 spirally in such a manner that prescribed gaps are formed in the longitudinal direction between its adjacent portions. In addition, since the one of the flat surfaces FS of the plated fiber bundle B faces the coil center line CC, when the post-fitting shield member 20 is expanded, the one flat surface FS is brought into surface contact with the outer surface of the electric wire 10.

In the post-fitting shield member 20 according to the embodiment, in a state that the plated fiber bundle B is wound on the electric wire 10 having an outer diameter D (see FIG. 1) spirally at a pitch P (see FIG. 1) after the post-fitting shield member 20 is post-fitted with the electric wire 10, it is preferable that the inner diameter d (see FIG. 2) of the plated fiber bundle B satisfies the following formula 1

[Formula 1]

$$d^2 = \{(\pi D)^2 + P^2\}/\pi^2. \quad (1)$$

This is because the inner diameter d that satisfies the above formula (1) allows the plated fiber bundle B to be wound on the electric wire 10 having the outer diameter D spirally at the pitch P.

Furthermore, it is preferable that the shielding ratio of the shielded wire 1 according to the embodiment be larger than or equal to 0.5. The shielding ratio is defined by (the area of the plated fiber bundle B per unit length)/(the surface area of the electric wire 10 per unit length). It is preferable that the following formula 2 is satisfied.

[Formula 2]

$$(T \times N \times L)/(\pi D \times L) \geq 0.5 \quad (2)$$

T is the width of each plated fiber bundle B (see FIG. 3), N is the number of plated fiber bundles B, L is the length of the electric wire 10 (see FIG. 1), and D is the outer diameter of the electric wire 10.

That is, the following formula 3 is satisfied.

[Formula 3]

$$TN/\pi D \geq 0.5 \quad (3)$$

This is because the shielding ratio in the above range makes it possible to secure a shielding effect that is larger than or equal to 30 dB which is, in general, considered a minimum allowable value.

Figure 4A:
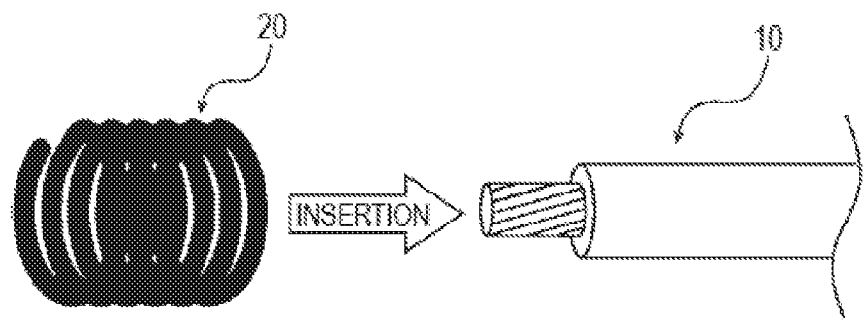
FIGS. 4A-4C show an insertion step, a first fixing step, and an expansion step, respectively, of a manufacturing method of a shielded wire according to the embodiment.
Figure 4B:
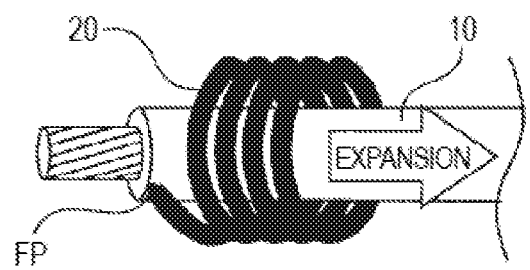
Figure 4C:
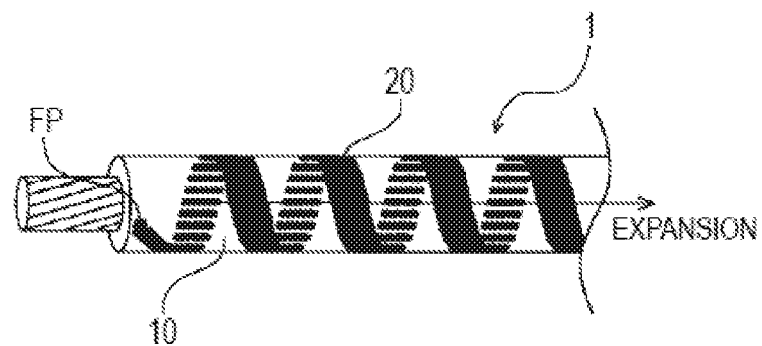

Next, a manufacturing method of a shielded wire 1 according to the embodiment will be described. FIGS. 4A-4C show an insertion step, a first fixing step, and an expansion step, respectively, of the manufacturing method of a shielded wire 1.

First, as shown in FIG. 4A, a worker prepares an electric wire 10 to be shielded and a post-fitting shield member 20 having a natural length. Then the worker inserts the electric wire 10 into the post-fitting shield member 20 (insertion step). Since the post-fitting shield member 20 having the natural length is as short as 50% or less of the length L of the shielded wire 1 (see FIG. 1), the electric wire 10 can be inserted easily.

Then, as shown in FIG. 4B, the worker fixes one end portion of the post-fitting shield member 20 (first fixing step). In the example of FIG. 4B, the outer surface of the electric wire 10 is formed with a fixing portion FP. The invention is not limited to the case that one end portion of the post-fitting shield member 20 is fixed to the outer surface of the electric wire 10; the one end portion of the post-fitting shield member 20 may be fixed to a shell of a shield connector or a grounding member (e.g., vehicle body). As a further alternative, the one end portion of the post-fitting shield member 20 may be fixed in such a manner that a terminal of a grounding housing room of a connector is crimped onto it (before insertion of the electric wire 10 into the post-fitting shield member 20).

Subsequently, as shown in FIG. 4B, the worker expands the post-fitting shield member 20 (the one end portion of which is fixed) toward the side of its other end (expansion step). As a result, the post-fitting shield member 20 is elongated so as to be as long as, for example, two or more times (preferable three or more times) its natural length. As a result, the one of the flat surfaces FS comes into close contact with the outer surface of the electric wire 10.

Then, as shown in FIG. 4C, the other end portion of the expanded post-fitting shield member 20 is fixed (second fixing step). The manufacture of the shielded wire 1 is thus completed. As in the first fixing step, there are no particular limitations on the fixing location in the second fixing step.

Next, a manufacturing method of a post-fitting shield member 20 according to the embodiment will be described. First, a worker prepares high-strength fiber members F and has them subjected to metal plating (plating step). As a result, a plated fiber bundle B (a bundle of plated fiber members MF) having a cross section shown in FIG. 3, for example, is obtained.

Then the worker winds up the plated fiber bundle B into a coil having a prescribed diameter and has it subjected to heat treatment of a prescribed temperature or higher and a prescribed time or longer (heat treatment step). The prescribed diameter is determined according to the diameter of an electric wire 10 to be shielded (so as to be larger than the diameter of the electric wire 10).

It is preferable that the prescribed temperature be 50° C. to 200° C. and the prescribed time is 3 minutes to 20 hours. If the heat treatment temperature is lower than 50° C., the degree of softening of the high-strength fiber members F is low and the plated fiber members MF cannot be compressed in a coil shape, rendering the post fitting difficult. If the heat treatment temperature is higher than 200° C., the high-strength fiber members F themselves are distorted and hence prescribed dimensions cannot be obtained.

If the heat treatment time is shorter than 3 minutes, the plated fiber members MF cannot be fixed in a coil shape, rendering the post fitting difficult. If the heat treatment time is longer than 20 hours, metal atoms of the inside metal plating layers M1 diffuse into the outside metal plating layer M2, to change the resistance value and render the shielding effect unstable.

More specifically, a plated fiber bundle B is obtained by performing plating on 300 members of Vectran (registered trademark) which is polyacrylate fiber produced by Kuraray Co., Ltd. and then wound on a SUS metal rod of 25 mm in diameter in coil form so that its adjacent portions have an interval that is equal to its width T. Then the plated fiber bundle B in coil form is subjected to heat treatment of 100° C. and 30 minutes in a constant-temperature bath produced by Co., Ltd. Isuzu Seisakusho.

Subsequently, that is, after the heat treatment, the worker cools the plated fiber bundle B to ordinary temperature, for example (cooling step).

The inventors found that high-strength fiber members F soften when subjected to heat treatment, and that when a coil-shaped plated fiber bundle B is then cooled, fiber shapes are fixed so that the plated fiber bundle B will maintain its shape.

Figure 5:
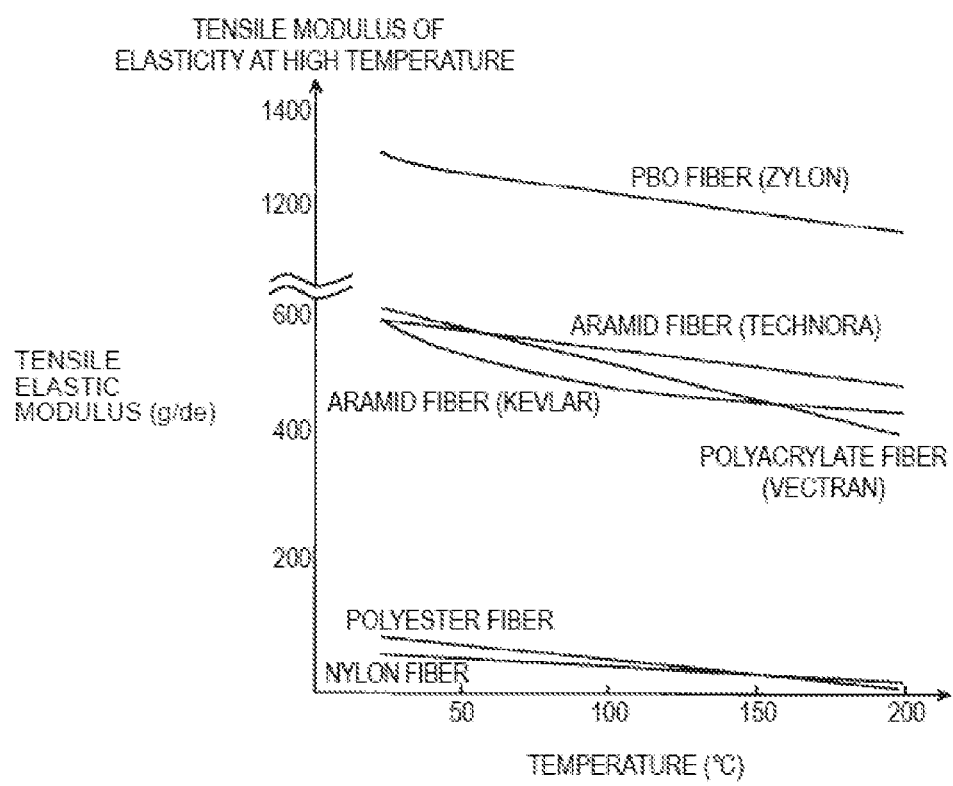
FIG. 5 is a graph showing a relationship between tensile elastic modulus and temperature of fiber.

FIG. 5 is a graph showing a relationship between the tensile modulus of elasticity and temperature of each of various kinds of fiber. It is seen from FIG. 5 that the tensile modulus of elasticity of each kind of fiber decreases as temperature increases. In particular, in fiber materials other than polyester fiber and nylon fiber (high-strength fiber), the elasticity lowers fast as temperature increases.

In general, molecules of fiber have orientation that varies to some extent when the fiber is heated. When the fiber is thereafter cooled, the orientation of molecules is fixed and the fiber material is fixed in shape. Thus, a post-fitting shield member 20 whose shape is fixed in coil form can be obtained by winding up a plated fiber bundle B into a coil shape, subjecting it to proper heat treatment, and then cooling it. Thus, the problem that a post-fitting shield member cannot keep a coil shape is overcome.

It is desirable to use high-strength fiber. Such general-purpose fiber materials as polyester fiber and nylon fiber can keep a coil shape when subjected to the above process. However, since they lose elasticity after being subjected to the process, no shape recovery occurs (left in an expanded state) after being expanded. This may cause peeling of plated layers, resulting deterioration in shielding effect.

FIG. 5 shows the characteristics of two kinds of aramid fiber (Kevlar (registered trademark) and Technora (registered trademark)), polyacrylate fiber (Vectran (registered trademark)), PBO fiber (Zylon), polyester fiber, and nylon fiber. Other kinds of aramid fiber, polyacrylate fiber, and PBO fiber exhibit characteristics that are similar to the ones shown in FIG. 5.

In the post-fitting shield member 20 according to the embodiment, since the plated fiber bundle B formed by performing metal plating on the high-strength fiber members F is wound in coil form, the high-strength fiber member F in the plating layers is not easily deformed plastically even if a plated fiber member MF is hooked on a certain member when the electric wire 10 is inserted into the coil-shaped plated fiber bundle B and the plated fiber bundle B is expanded. Thus, a pitch deviation due to plastic deformation can be prevented. Furthermore, even if external force acts on the expanded post-fitting shield member 20, the high-strength fiber members F are not easily deformed plastically but maintained in shape. Thus, the post-fitting shield member 20 does not make post fitting difficult and is given a uniform pitch distribution after its expansion.

Since the plated fiber bundle B is thin and flat and one of the flat surfaces FS faces the coil center line CC, when the plated fiber bundle B is used as part of the shielded wire 1, its one flat surface FS comes into contact with the electric wire 10. As a result, the close contactness between the plated fiber bundle B and the electric wire 10 is increased to stabilize the shielding effect. Furthermore, the shielded wire 1 is covered with a wide plated fiber bundle B, whereby the shielding performance can be enhanced.

Since Inequality (1) is satisfied, the plated fiber bundle B can be wound spirally at the pitch P on the electric wire 10 having the outer diameter D.

The shielded wire 1 according to the embodiment is equipped with the post-fitting shield member 20 and the electric wire 10. And the post-fitting shield member 20 is in a state that it is elongated so as to be longer than its natural length and wound on the electric wire 10 spirally. Since the electric wire 10 is inserted into the post-fitting shield member 20 that has not been expanded yet, the efficiency of work can be made higher than in a case that it is inserted into a post-fitting shield member that is long in its longitudinal direction.

Since the shielded wire 1 satisfies the relationship of Inequality (3), it exhibits a shielding effect that is larger than or equal to 30 dB which is, in general, considered a minimum allowable level.

The manufacturing method of a shielded wire 1 according to the embodiment is higher in work efficiency than in a case that the electric wire 10 is inserted into a post-fitting shield member that is long in its longitudinal direction.

The present inventors found that high-strength fiber members F soften when subjected to heat treatment, and that when a coil-shaped plated fiber bundle B is then cooled, fiber shapes are fixed so that the plated fiber bundle B will maintain its shape. Thus, the manufacturing method of a post-fitting shield member 20 according to the embodiment can produce a post-fitting shield member 20 in which a coil shape is maintained by winding the plated fiber bundle B into a coil shape having a prescribed diameter, subjecting it to heat treatment, and then cooling it.

Although the invention has been described above by way of the embodiment, the invention is not limited to the embodiment. Various modifications are possible without departing from the spirit and scope of the invention, and the embodiment may be combined with known techniques.

For example, although in the embodiment the post-fitting shield member 20 is provided directly on the electric wire 10, the invention is not limited to this case; a certain thing may be interposed between the post-fitting shield member 20 and the electric wire 10. Although in the embodiment the post-fitting shield member 20 is provided on the single electric wire 10, the invention is not limited to this case; the post-fitting shield member 20 may be provided on plural electric wires.

Although the post-fitting shield member 20 according to the embodiment is thin and flat in cross section, it may have any of various other shapes. Although in the example of FIG. 1 the post-fitting shield member 20 is wound in a Z direction (Z-twist), it may be wound in an S direction (S-twist).

Furthermore, although in the shielded wire 1 according to the embodiment the one plated fiber bundle B is wound on the electric wire 10 spirally, the invention is not limited to this case; two or more plated fiber bundles B may be wound on the electric wire 10 spirally. Even where two or more plated fiber bundles B are used, since they are expanded to constitute the shield wire 1, prescribed gaps are formed between the plated fiber bundles B.

What is claimed is:

1. A post-fitting shield member to be post-fitted with an electric wire comprising:
    a plated fiber bundle with metal plating on a high-strength fiber member,
    wherein the plated fiber bundle is wound in a coil shape, and
    wherein the high-strength fiber member is larger than or equal to 1 GPA in breaking tensile strength and is from 1% to 10% in breaking extension ratio.

2. The post-fitting shield member according to claim 1, wherein the plated fiber bundle is thin and flat, and has a flat surface being one of an upper surface and a bottom surface in a thickness direction of the plated fiber bundle, the flat surface facing a center line of the coil shape.

3. The post-fitting shield member according to claim 1, wherein in state that the plated fiber bundle is wound on the electric wire spirally, $d^2=\{(\pi D)^2+P^2\}/\pi^2$ is satisfied,
    where d is an inner diameter of the plated fiber bundle,
    D is an outer diameter of the electric wire, and
    P is a pitch P after the post-fitting shield member is post-fitted with the electric wire.

4. A shielded wire comprising:
    the post-fitting shield member according to claim 1; and
    an electric wire which is inserted in the post-fitting shield member having the coil shape,
    wherein the post-fitting shield member is in a state that it is elongated so as to be longer than its natural length and wound on the electric wire spirally.

5. The shielded wire according to claim 4, wherein $TN/\pi D \geq 0.5$ is satisfied,
    where T is the width of each plated fiber bundle,
    N is a number of plated fiber bundles, and
    D is the outer diameter of the electric wire.

6. A manufacturing method of a shielded wire comprising:
    an insertion step of inserting an electric wire into the post-fitting shield member according to claim 1 having the coil shape;
    a first fixing step of fixing one end portion of the post-fitting shield member into which the electric wire was inserted in the insertion step;
    an expansion step of expanding the post-fitting shield member that was fixed in the first fixing step toward a side of another end portion of the post-fitting shield member; and
    a second fixing step of fixing the other end portion of the post-fitting shield member that was expanded in the expansion step.

7. A manufacturing method of a post-fitting shield member comprising:
    a plating step of performing metal plating on a high-strength fiber member;
    a heat treatment step of winding a plated fiber bundle obtained by the plating step into a coil shape and subjecting the wound plated fiber bundle to heat treatment of a prescribed temperature or higher and a prescribed time or longer; and
    a cooling step of cooling the wound plated fiber bundle as subjected to the heat treatment.

* * * * *